Dec. 10, 1968 R. J. KINKAID 3,416,122

ELECTRICAL CONNECTORS FOR TERMINATING LEADS OF MICRO-MODULAR COMPONENTS OR THE LIKE

Filed March 21, 1966 5 Sheets-Sheet 1

Dec. 10, 1968 R. J. KINKAID 3,416,122

ELECTRICAL CONNECTORS FOR TERMINATING LEADS OF MICRO-MODULAR COMPONENTS OR THE LIKE

Filed March 21, 1966 5 Sheets-Sheet 5

United States Patent Office 3,416,122
Patented Dec. 10, 1968

3,416,122

ELECTRICAL CONNECTORS FOR TERMINATING LEADS OF MICRO-MODULAR COMPONENTS OR THE LIKE

Robert John Kinkaid, New Cumberland, Pa., assignor to AMP Incorporated, Harrisburg, Pa.
Filed Mar. 21, 1966, Ser. No. 535,939
14 Claims. (Cl. 339—17)

ABSTRACT OF THE DISCLOSURE

A connector construction comprises a carrier member for carrying a micro-modular component having a series of leads extending outwardly therefrom with pin members disposed in the carrier member including crimping members for receiving the leads and in which the leads are crimped to provide a carrier assembly unitable to a board or mounting means for interconnection with other circuitry thereon.

This invention relates to electrical connectors and more particularly to electrical connectors for terminating leads of micro-modular components or the like.

In the field of micro-modular components, such as for example, that of the flat pack variety, leads extending outwardly therefrom have to be terminated in order to connect the components with other circuitry to formulate a complete circuit arrangement. In view of the smallness of these components, termination of the leads thereof has been a problem, and solving of the termination problem for these components has been of significant importance since the effective use of these components is a prevalent concept in present and future electronic design capabilities. Another problem of terminating leads of micro-modular components is that of subjecting the termination of the components to high speed terminating techniques which is receptive to automation capabilities. A further problem of terminating leads of micro-modular components is that of providing terminations thereof having high reliability. An additional problem of terminating leads of micro-modular components is that care must be taken so that the leads are properly terminated to prevent shorting of one lead to another and that the leads are not disconnected from the components during the termination operation.

A primary object of the invention is to provide electrical connectors for terminating leads of relatively small or micro-modular components.

Another object of the invention is to provide electrical connectors for terminating leads of relatively small or micro-modular components that is susceptible to high speed or automation capabilities.

A further object of the invention is the provision of an electrical connector for terminating leads of relatively small or micro-modular components having high reliability, the leads are properly terminated without shorting of one lead to another and the leads are not disconnected from the components during the termination operation.

An additional object of the invention is to provide a unique crimp configuration between respective leads and crimping ferrules and a method to simultaneously crimp the ferrules in adjacent planes.

A still further object of the invention is to provide an electrical connection that has excellent mechanical and electrical characteristics and does not damage the connections of the leads from which they emanate.

Still an additional object of the invention is to provide a securing section on the electrical connector to secure the electrical connector within a circular opening of a mounting member.

Other objects and attainments of the present invention will become apparent to those skilled in the art upon a reading of the following detailed description when taken in conjunction with the drawings in which there are shown and described illustrative embodiments of the invention; it is to be understood, however, that these embodiments are not intended to be exhaustive nor limiting of the invention but are given for purposes of illustration in order that others skilled in the art may fully understand the invention and the principles thereof and the manner of applying it in practical use so that they may modify it in various forms, each as may be best suited to the conditions of a particular use.

The foregoing objects are achieved in the present invention through the provision of a connector construction having a carrier member for carrying a micro-modular component having leads extending outwardly therefrom, pin members disposed in the carrier member including crimping members for receiving the leads and in which the leads are crimped to provide a carrier assembly unitable to a board or mounting means for interconnection with other circuitry.

Figures 1, 2, 2A, 3, 4:
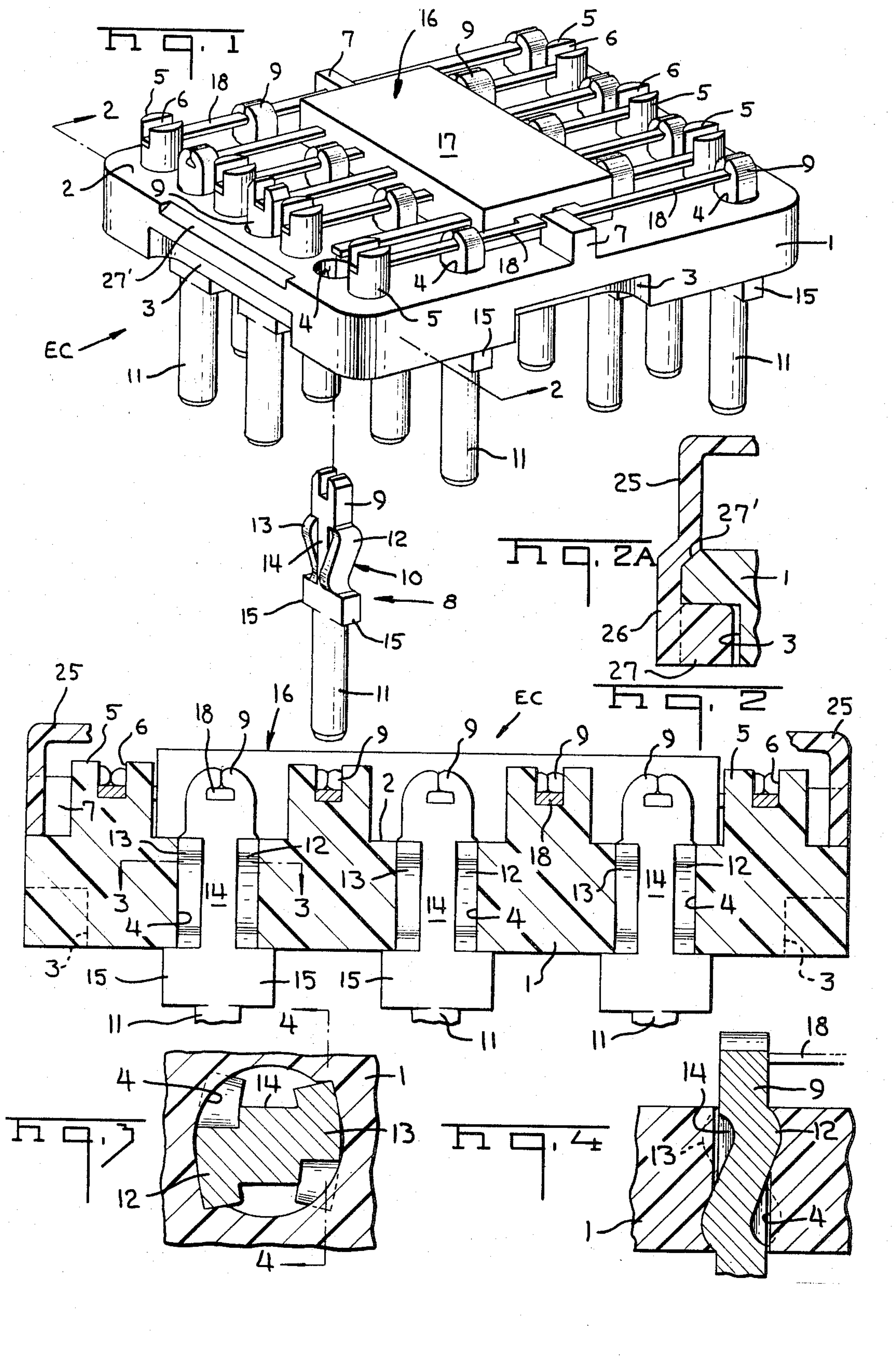
FIGURE 1 is an exploded perspective view of an electrical connector according to the present invention.
FIGURE 2 is a view taken along lines 2—2 of FIGURE 1.
Figures 5, 9:
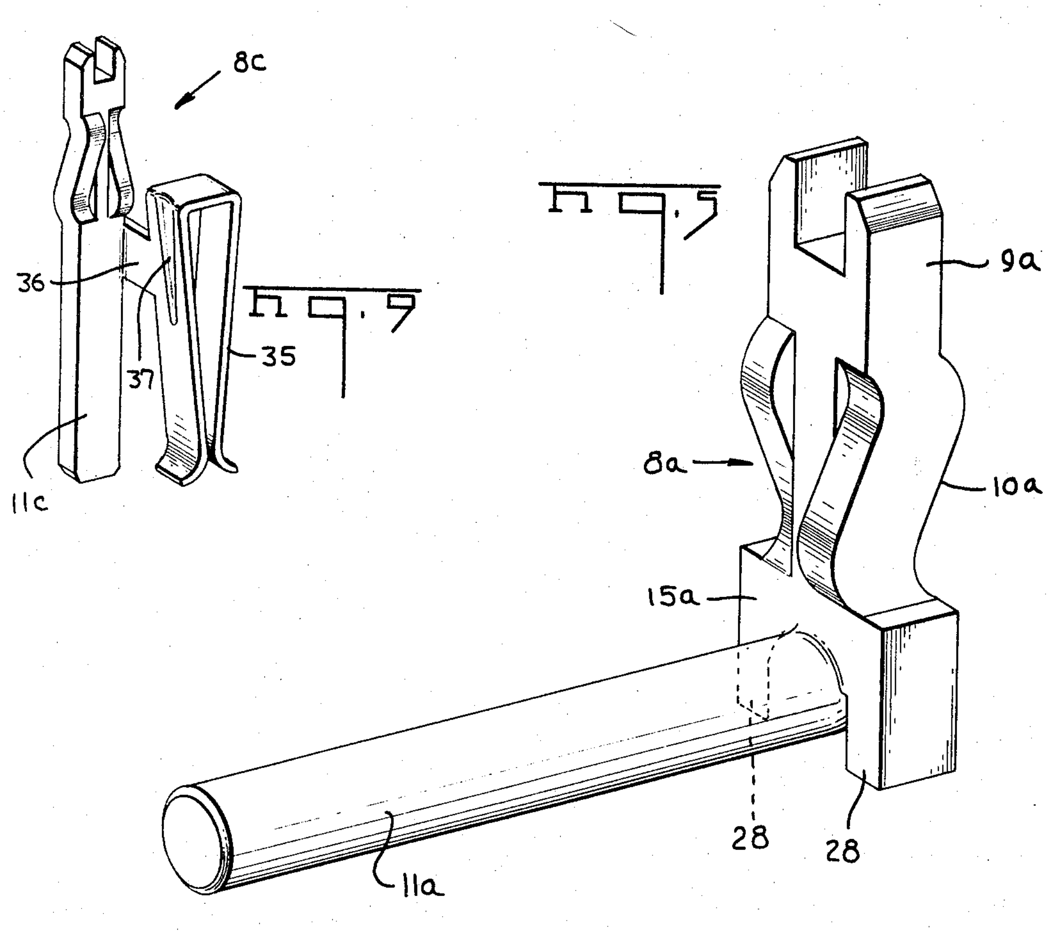
Figure 6:
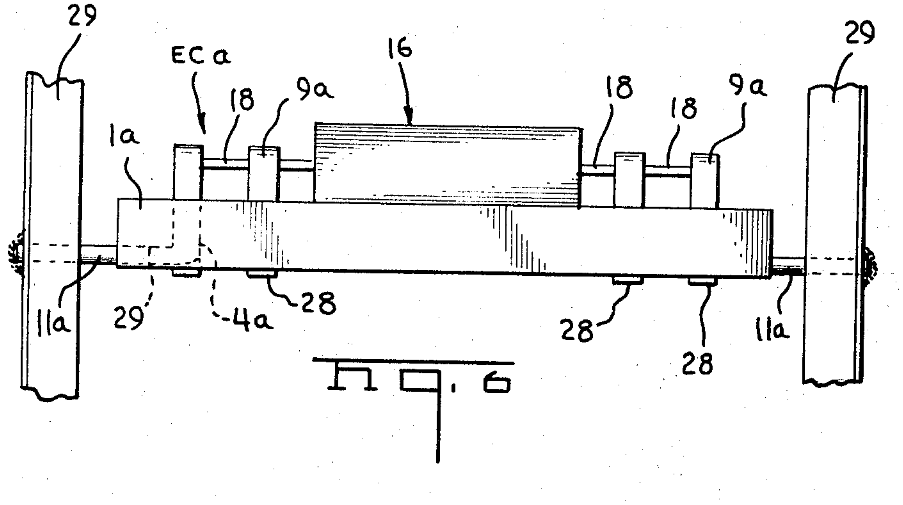
Figure 7:
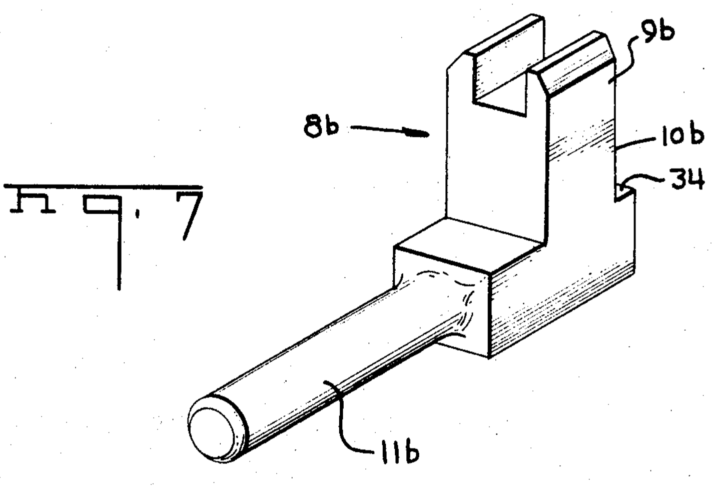
Figure 8:
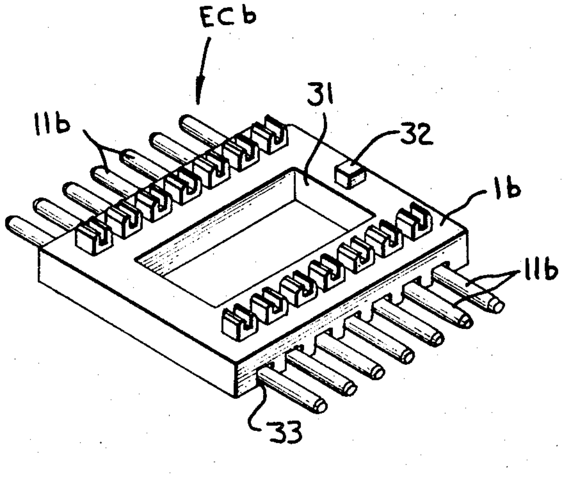
Figure 11:
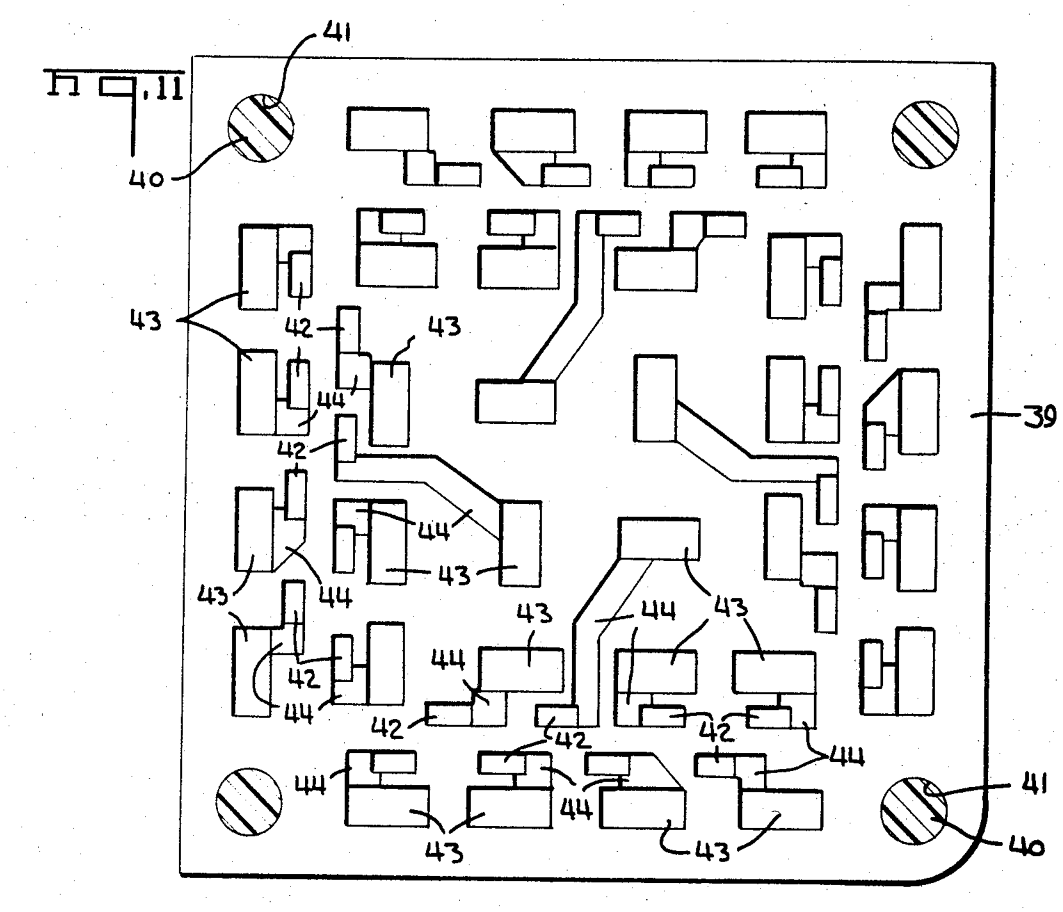
Figure 10:
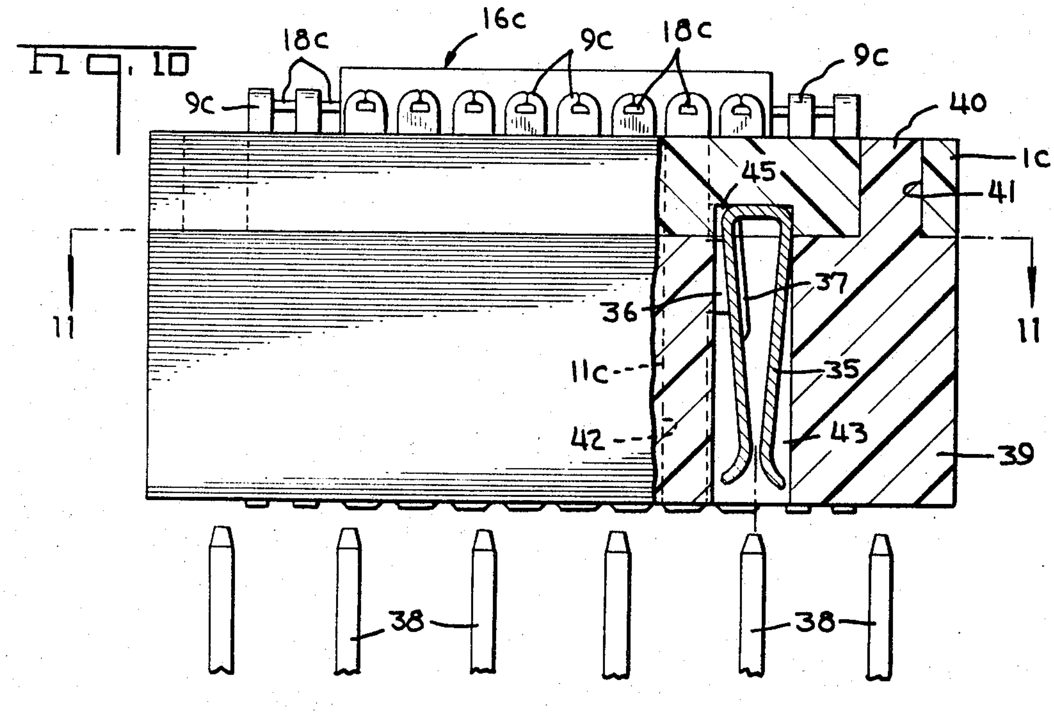

FIGURE 2*a* is a partial cross-sectional view illustrating the cover latched to the carrier member;

FIGURE 3 is a view taken along lines 3—3 of FIGURE 2;

FIGURE 4 is a view taken along lines 4—4 of FIGURE 3;

FIGURE 5 is a perspective view of an alternative embodiment of the electrical terminal;

FIGURE 6 is a view illustrating a use of the electrical terminal of FIGURE 5;

FIGURE 7 is a perspective view of another embodiment of the electrical terminal;

FIGURE 8 is a perspective view of an alternative embodiment of the electrical connector;

FIGURE 9 is a perspective view of an additional embodiment of the invention;

FIGURE 10 is an exploded, part sectional and side elevational view illustrating the electrical terminal of FIGURE 7 in position in its carrier member;

FIGURE 11 is a view taken along lines 11—11 of FIGURE 10; and

Figure 12:
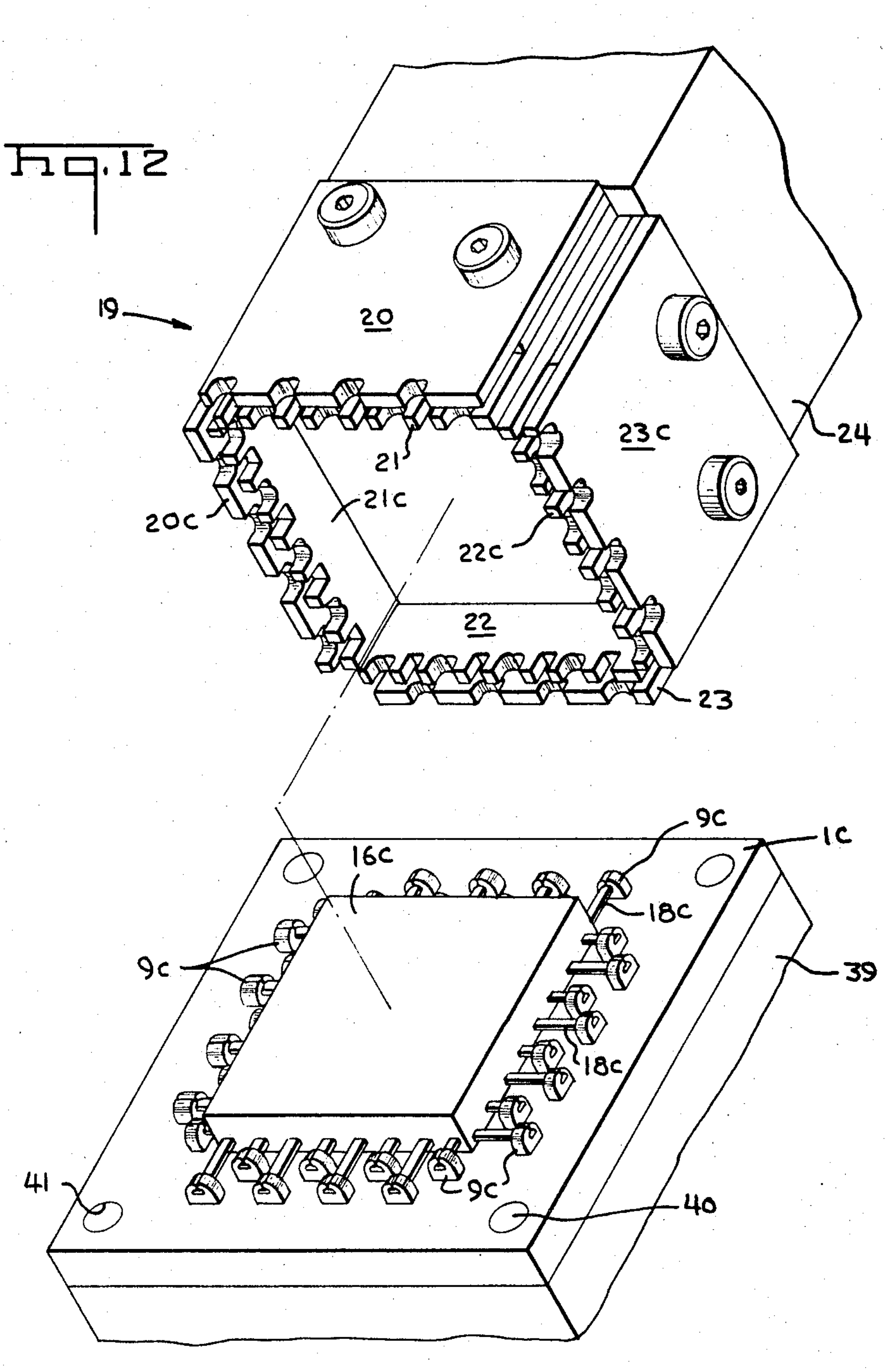

FIGURE 12 is an exploded perspective view illustrating the crimping die to crimp the electrical terminals.

Turning now to the drawings and more particularly FIGURES 1 through 4, there is illustrated an electrical connector EC comprising a dielectric carrier member 1 having a top flat surface 2 and depressions 3 disposed in each side of carrier member 1. Circular openings 4 extend through carrier member 1 along each side thereof and these openings are disposed in staggered relationship therealong. Lead-receiving projections 5 are disposed between each of openings 4 in each outer row opposite a respective opening of the inner rows. Slot 6 is disposed in each of projections 5. Projections 5 may be disposed between adjacent rows of openings 4 opposite a respective opening of the inner rows, if desired. Projections 7 extend outwardly from the upper surface of dielectric carrier member 1 over a respective depression 3.

Extensions may extend outwardly from the bottom surface of carrier member 1 and may be arranged in any suitable manner to provide a keying arrangement to assure proper positioning of the connector onto a mounting member so that the micro-modular component on the carrier member is properly positioned on the mounting member in accordance with its electrical characteristics.

Electrical terminals 8 are disposed in dielectric carrier member 1 within each opening 4 as illustrated in FIGURES 1 through 4. Each of electrical terminals 8 comprises a U-shaped lead-receiving section 9, a securing section 10 and a connection section 11. The outer ends of the outside surfaces of the legs of section 9 are beveled. Securing section 10 includes portions 12 and 13 having an undulating or sinusoidal configuration disposed on each side of a central shank 14. The disposition of portions 12 and 13 is opposite to each other in that the curved portions or edges of portion 12 extending outwardly from shank 14 are oppositely disposed with respect to the curved portions or edges of portion 13 extending outwardly from shank 14. Lugs 15 are located at the junction between securing section 10 and connection section 11 and extend outwardly therefrom. Connection section 11 is illustrated as being round in order to be pluggable within a receptable (not shown) or be solderable onto a printed circuit board. Connection section 11 can, however, take any suitable configuration in order to terminate a conductive member thereto such as, for example, section 11 may have a configuration to receive a connector of the type illustrated and disclosed in U.S. Patent No. 3,191,281 or be susceptible to wire wrapping techniques, or the like.

Carrier member 1 is preferably molded from a suitable plastic material in accordance with conventional molding techniques and electrical terminals 8 are susceptible to mass production by automatic machinery and are conveniently formed by shaping a sheet metal blank or strip of suitable electrical conductive material in successive forming steps in accordance with conventional stamping techniques.

In assembly to form electrical connector EC, electrical terminals 8 are disposed within carrier member 1 with securing sections 10 being disposed within openings 4 so that lead-receiving sections 9 extend above flat surface 2. Sections 9 are disposed in parallel planes extending parallel to projections 7. Lugs 15 abut against the bottom surface of carrier member 1 to limit the movement of terminals 8 within openings 4 and to provide side-wise stabilization thereto. The electrical terminals are securely held in position within respective openings 4 by means of sinusoidal portions 12 and 13. As can be discerned, the outwardly curved portions of sinusoidal portions 12 and 13 facilitate the insertion of the electrical terminals within openings 4 and these curved portions act somewhat in the manner of the self-threading technique by biting into the walls of openings 4 as illustrated in FIGURES 3 and 4. After securing sections 10 have been secured within respective openings 4 by means of sinusoidal portions 12 and 13, the dielectric material of carrier member 1 tightly grips these portions at spaced locations which are opposed to each other as illustrated in FIGURES 3 and 4, which prevent any turning movement of the electrical terminals within openings 4. Of course, securing section 10 may be used on electrical terminals other than those disclosed.

With electrical terminals 8 in place within openings 4 of carrier member 1, electrical connector EC is now ready to receive micro-modular component 16. This component comprises a generally box-shaped, insulated housing 17 having leads 18 from 2 to $n$ number extending outwardly therefrom. In the component illustrated in FIGURE 1, leads 18 extend outwardly from each side and from each end. Two leads extend outwardly from each end of housing 17 with one of these leads extending slightly outwardly from its end and then extending parallel with respect to and in the same direction as the leads extending outwardly from one side. The other lead extending outwardly from this end is spaced from the one lead and extends in an opposite direction thereto. Thus, each set of leads at the end are spaced from each other and extend in opposite directions with respect to each other. Leads 18 are connected to appropriate circuitry within housing 17, and housing 17 is a sealed housing so that at the points of emanation of leads 18 therefrom, there is a sealed condition thereat. Rupture of any one of these sealed points results in a damaged component which is not susceptible for use.

Component 16 is disposed within the area defined by the inner rows of lead-receiving sections 9 of terminals 8 and projections 7 and the leads extending outwardly from the ends of housing 17 are placed on each side of projections 7. Thus, projections 7 orient component 16 in position within the component-receiving area so that leads 18 are properly disposed within respective lead-receiving sections 9 and slot 6 of lead-receiving projections 5. With leads 18 properly placed in lead-receiving sections 9 and with carrier member 1 and component 16 held in position within a crimping area of a crimping machine (not shown) so that connection sections 11 are disposed in openings thereof and lugs 15 rest on a surface of the anvil portion of the crimping machine, a crimping-die means 19, as illustrated in FIGURE 12 which would be provided with parallel spaced crimping-die plates 20 through 23 secured on ram member 24, is brought into engagement with lead-receiving sections 9 to subject these sections to a crimping operation by the crimping-die means to crimp the sections to leads 18 as illustrated in FIGURES 1 and 2. Crimping-die plates may also be provided on ram member 24 between respective pairs of crimping-die plates 20, 21 and 22, 23 in order to engage projections 5 to distort these projections to exceed their elastic limit to retain leads 18 in slots 6. Projections 5 serve only as a holder to hold the ends of the leads connected to the terminals in the inner rows.

The crimping operation causes the beveled ends of the legs of sections 9 to be arcuately bent toward each other until these ends abut and then the crimping dies press the abutted legs into engagement with the leads. The abutted ends of the legs of section 9 prevent overcrimping the terminals to the point of fatiguing the leads in their crimped areas.

Since, as was pointed out hereinabove, it is important that leads 18 are not to be subjected to excessive pressures during the crimping operation in order not to break the seal between housing 17 and leads 18, the crimped connection of the present invention is such that the leg members of lead-receiving sections 9 are brought into engagement with leads 18 in such a controlled manner so that excellent mechanical and electrical connection is effected without subjecting leads 18 to crimping pressure that would cause leads 18 to undergo enough movement to break the seal between these leads and housing 17. It is also important to note that lugs 15 engage the anvil means of the crimping machine so that the electrical terminals are not driven outwardly from their secured positions within carrier member 1. The crimping operation on sections 9 can be undertaken to crimp each section 9 individually, crimp sections 9 on only one side and then on the other or crimp all the lead-receiving sections simultaneously, as desired.

In assembling electrical connectors EC and crimping components 16 thereto, they can readily be subjected to automation capabilities by feeding carrier members 1 to a station, securing electrical terminals 8 in openings 4, moving the carrier member and terminals in place therein to another station whereat the assembled electrical connector is placed within openings of an anvil means, moving the electrical connector and anvil means to a further station, placing a component 16 within the component-receiving area, moving the anvil means, electrical connector and component in place thereon to a crimping station, crimping lead-receiving sections 9 onto the leads of component 16, and ejecting the unitary structure of electrical connector EC having crimped thereon component 16 as a unit for being secured onto a mounting member by pluggable or solderable techniques or to be secured onto a mounting member so that connection section 11 may be terminated by means of termination techniques disclosed in the above-mentioned U.S. patent or by wire-wrapping techniques to perform point-to-point wiring.

A protective cover 25, preferably molded from a suitable dielectric material, fits on top of carrier member 1 with its edges in engagement with surface 2 as illustrated in FIGURE 2. Recesses are provided in opposing sides of cover 25 to accommodate projections 7. Extensions 26 extend outwardly from the sides accommodating projections 7, and inwardly-directed lugs 27 are located at the outer ends of extensions 26 for matable engagement with depressions 3 under projections 7. Inwardly-directed lugs 27 maintain cover 25 in position on carrier member 1 as illustrated in FIGURE 2. Beveled surfaces 27' are located in carrier member 1 in alignment with depressions 3 to facilitate the movement of lugs 27 within depressions 3. The other depressions receive inwardly-directed ends of a tool (not shown) to handle the connector.

Turning now to FIGURES 5 and 6, there is illustrated an embodiment of the invention. In this embodiment, electrical terminal 8*a* is the same as electrical terminal 8 except that connection section 11*a* is disposed normal to sections 9*a* and 10*a*. Lugs 15*a* include extensions 28 which extend below connection section 11*a*. Terminals 8*a* are disposed in openings 4*a* of carrier member 1*a* and are secured therein by means of securing section 10*a*. Extensions 28 extend below the bottom surface of carrier member 1*a* and engage an anvil means of a crimping machine while the crimping-die means engage sections 9*a* to crimp these sections onto leads 18 of component 16. Recesses 29 are disposed in the bottom surface of dielectric carrier member 1*a* in communication with respective openings 4*a* in order to accommodate connection sections 11*a* as illustrated in FIGURE 6. Of course, connection sections 11*a* of the inner row of terminals 8*a* are longer than the connection sections of the terminals disposed in the outer rows. Connection sections 11*a* therefore extend outwardly from opposing sides of dielectric carrier member 1*a* and are securable to appropriate circuitry of parallel disposed printed circuit boards 30 as illustrated in FIGURE 6. The embodiment of FIGURES 5 and 6 permits electrical connectors EC*a* to be stacked in parallel relationship relative to each other for high density purposes.

A similar embodiment is illustrated in FIGURES 7 and 8 wherein electrical terminal 8*b* is similar to electrical terminal 8*a* except that no lugs are provided at the bottom of securing section 10*b* and securing section 10*b* is rectangular-shaped in cross section, however, securing section 10*b* may be identical to securing sections 10 and 10*a* of terminals 8 and 8*a* respectively, if desired. Dielectric carrier 1*b* of electrical connector EC*b* has a rectangular opening 31 disposed centrally thereof. A polarizing projection 32 extends outwardly from the top surface of carrier member 1*b*. Circular openings 4*b* are disposed in parallel rows intermediate respective sides of carrier member 1*b* and opening 30. As can be discerned, there is only a single row of openings 4*b* on each side of opening 30 to accommodate securing sections 10*b* of terminals 8*b*. Recesses 33 are disposed in the bottom surface of carrier member 1*b* in communication with respective openings 4*b* to accommodate connection sections 11*b* so that these connection sections extend outwardly from the sides of the carrier member in the same manner as the embodiment of FIGURES 5 and 6 for high density connection between mounting members of the printed circuit board variety. A micro-modular component is disposed within opening 31 and polarizing projection 32 assures that the leads of the micro-modular component are properly positioned within respective lead receiving sections 9*b* of terminals 8*b*. The bottom surfaces of securing sections 10*b* of terminals 8*b* are disposed in the same plane as the bottom surface of carrier member 1*b* in order to be disposed on an anvil means of a crimping machine when the crimping die means is operated to crimp lead-receiving sections 9*b* onto the leads of the micro-modular component. An extension 34 extends outwardly from securing section 10*b* in a direction opposite to that of connection section 11*b* in order to provide stabilization of the terminal member within its respective opening in carrier member 1*b*.

Since the micro-modular component rests within opening 30 of carrier member 1*b*, the overall thickness of the electrical connector with its micro-modular components crimped thereon is decreased so that higher density terminations result. Opening 30 also provides ventilation for the micro-modular component. One corner of dielectric carrier member 1*b* is beveled to provide a polarizing or keying arrangement to properly position the carrier member before termination thereof is effected.

The electrical connector of FIGURE 8 is unique in that the electrical terminals in each row on each side of opening 31 are positioned at very small distances at non-staggered locations, the thickness of the electrical connector and the micro-modular component secured thereon is decreased to provide high density terminations and the micro-modular component is effectively ventilated.

Micro-modular components are presently being manufactured with leads emanating outwardly from all four sides thereof as illustrated in FIGURE 12. FIGURES 9 through 12 are directed to an additional embodiment of the invention. Electrical terminal 8*c* of FIGURE 9 is similar to that disclosed in FIGURE 1 except that a U-shaped spring clip 35 is connected to post 11*c* by means of an extension 36. An inwardly directed depression 37 is disposed in one of the legs of clip 35 and the legs are tapered toward each other at their outer ends and the outer ends are arcuate-shaped to facilitate engagement with a respective post 38, FIGURE 10, disposed on a mounting member (not shown). Inwardly-directed depression 37 is disposed in the leg containing extension 36 because it is the shorter of the two legs and depression 37 provides additional rigidity to this leg to equal the spring characteristics of the longer leg.

Terminals 8*c* are secured in respective openings of a dielectric carrier member 1*c* in parallel staggered rows which are parallel to each side of the carrier member as illustrated in FIGURE 12. The inner rows of the terminal members define a component-receiving area in which a micro-modular component 16*c* is disposed which has leads 18*c* extending outwardly from each side thereof. Leads 18*c* are disposed in respective lead-receiving sections 9*c* and these leads are crimped thereto by means of crimping-die means 19 having crimping-die plates 20 through 23 and 20*c* through 23*c* to simultaneously crimp all of sections 9*c*.

Carrier member 1 is secured to a dielectric block 39 by means of projections 40 matable with corresponding holes 41 in carrier member 1. Block 39 has apertures 42 extending therethrough corresponding to the positions of respective openings in carrier member 1*c* in which the terminal members are disposed. Apertures 42 receive posts 11*c* and the ends of these posts extend slightly below the bottom surface of block 39 in order to engage an anvil means during the crimping operation on sections 9*c* of the terminals. Offset from apertures 42 are openings 43 in which spring clips 35 are disposed. Channels 44 are disposed in block 39 in communication between respective apertures 42 and openings 43 to accommodate extensions 36 of the terminals. As can be discerned from FIGURE 11, apertures 42, openings 43 and channels 44 are arranged in block 39 in identical fashion in each side so as to properly mate with respective posts 38. The bottom surface of carrier member 1*c* has recesses 45 disposed opposite respective openings 43 in order to accommodate the bights of spring clips 35 as illustrated in FIGURE 10.

All of sections 9*c* of the terminals may be simultaneously crimped, however, the crimping operation may take the form of crimping only one side at a time, or crimping opposing or adjacent sides simultaneously and then rotating the carrier member or the crimping-die means to crimp the other opposing or adjacent sides.

In the event that the crimped connections extrude the leads to an extent whereby the sealed connections between the leads and component 16 are effected, leads 18 may be provided with a relief area therein to prevent the leads from breaking the seal during the crimping operation. This relief area can take the form of a small bend in each of the leads.

As can be discerned, there has been disclosed a unique electrical connector for terminating leads of a micro-modular component or the like that is highly susceptible to fast terminations therefore being receptive to automation capabilities, it improves the reliability of the termination and has less complexities and controls as opposed to welding or soldering since the surfaces to be terminated do not have to be prepared, the surfaces do not have to be cleaned, no fluxes are necessary and no preformed jigs or the like are needed to form the crimped terminations. The electrical terminals are also submitted to be unique in that these terminals are provided with securing sections to secure the terminals in fixed positions in the dielectric carrier member in proper alignment to receive the leads of the micro-modular component.

It will, therefore, be appreciated that the aforementioned and other desirable objects have been achieved; however, it should be emphasized that the particular embodiments of the invention, which are shown and described herein, are intended as merely illustrative and not as restrictive of the invention.

What is claimed is:

1. An electrical connector for terminating a series of leads of an electrical component comprising a dielectric carrier member having a space for receiving said electrical component, electrical terminal means in said carrier member and including crimpable lead-receiving sections positioned to receive the series of leads of said component, means securing said terminal means in said carrier member, means spaced from said lead-receiving sections for engaging an anvil member of a crimping means during a crimping operation to crimp said leads to said lead-receiving sections, and means extending outwardly from said terminal means for electrical engagement with electrical circuitry.

2. An electrical connector according to claim 1 wherein said carrier member includes aligning means to properly align said component on said space so that said leads are properly positioned within said lead-receiving sections.

3. An electrical connector according to claim 1 wherein said carrier member includes crimpable lead-receiving projections disposed opposite some of said terminal means to support the leads crimped in these terminal means that extend outwardly therefrom.

4. An electrical connector for terminating a series of leads of an electrical component and being connectable onto a mounting member with other circuitry, said electrical connector comprising a dielectric carrier member having a component-receiving area for receiving said electrical component, electrical terminal members having securing, lead-receiving, and connection sections, said securing sections being securely disposed in said carrier member adjacent said component-receiving area, said lead-receiving sections extending outwardly from one surface means of said carrier member and being positioned to receive the series of leads of said component, said lead-receiving sections being crimped onto the leads while in position on said carrier member to form electrical connections therebetween, said connection sections extending outwardly from another surface means of said carrier member, and lug means on said terminal members being engageable with said other surface means to limit the movement of the terminal members in said carrier member and to stabilize said terminal members in position in said carrier member.

5. For use with a mounting panel to interconnect electrical component means with each other; an electrical connector insertable onto said mounting panel comprising a dielectric carrier member provided with space on one surface for receiving electrical component means having a series of leads; said carrier member having at least one row of openings adjacent at least two sides of said space; terminal means having a first section securable in each of said openings, a second section extending outwardly from another surface of said carrier member for connection to a conductive means and a third section extending outwardly from said one surface of said carrier member and being positioned to receive a respective lead of the series of leads of said electrical component means and being crimpable onto said lead to form an electrical connection between said lead and terminal means; and means on said terminal means for engagement with an anvil means of a crimping means during crimping of said terminal means.

6. The electrical connector of claim 5 wherein said openings in said rows are staggered relative to each other.

7. The electrical connector of claim 5 wherein each side of said space has two rows of aligned openings adjacent thereto and said openings in said rows are staggered relative to each other.

8. The electrical connector of claim 5 wherein said second sections of said terminal means extend outwardly from a bottom surface of said carrier member.

9. The electrical connector of claim 5 wherein said second sections of said terminal means extend outwardly from sides of said carrier member.

10. The electrical connector of claim 5 wherein integral projection means on said carrier member adjacent said space provides proper positioning of said electrical component means on said space so that said leads are properly positioned within said third sections of said terminal means.

11. A method of crimping a series of electrical terminals to a series of electrical leads of an electrical component comprising the steps of securing said electrical terminals in a carrier member in aligned rows adjacent each other to form an electrical interconnecting device, placing the series of electrical leads of the electrical component in respective lead-receiving sections of said electrical terminals, disposing the electrical interconnecting device with the electrical leads in position within the lead-receiving sections between an anvil means and crimping-die means of a crimping machine with said electrical interconnecting device resting on said anvil means, and moving said crimping-die means having a crimping area in corresponding alignment with each of said electrical terminals into engagement with said lead-receiving sections to simultaneously crimp all of said lead-receiving sections to said electrical leads to form a mechanical and electrical connection therebetween.

12. A method according to claim 11 wherein said rows are parallel to each other.

13. A method according to claim 11 wherein said rows are parallel to each other and said electrical terminals in one row are staggered relative to said electrical terminals in another row.

14. A method according to claim 11 wherein said rows are parallel to each other in one direction and said rows are parallel to each other in another direction.

References Cited

UNITED STATES PATENTS

| | | | |
|---|---|---|---|
| 2,066,876 | 1/1937 | Carpenter et al. | 29—155.5 |
| 2,169,593 | 8/1939 | Popp | 339—276 |
| 2,451,393 | 10/1948 | Kershaw | 339—276 |
| 2,563,775 | 8/1951 | Del Camp | 339—221 |
| 2,748,366 | 5/1956 | Bergan | 339—276 |
| 3,075,167 | 1/1963 | Kinkaid | 339—276 |
| 3,104,925 | 9/1963 | Macnamara | 339—276 |

(Other references on following page)

UNITED STATES PATENTS

| | | | |
|---|---|---|---|
| 3,123,664 | 3/1964 | Logan | 339—276 |
| 3,184,699 | 5/1965 | Spera | 339—221 |
| 3,233,034 | 2/1966 | Grabbe | 339—276 |
| 3,289,048 | 11/1966 | Allegretti et al. | 29—155.56 |
| 2,762,026 | 9/1956 | Knohl | 339—217 |
| 2,814,024 | 11/1957 | Marozny | 339—217 |
| 3,297,974 | 1/1967 | Pittman | 339—17 |
| 3,223,960 | 12/1965 | Ruehlemann | 339—221 |

FOREIGN PATENTS 760,326 10/1956 Great Britain.

MARVIN A. CHAMPION, *Primary Examiner.*

U.S. Cl. X.R.

339—221, 276; 317—101; 29—203, 628